(12) United States Patent
Van Veldhoven et al.

(10) Patent No.: US 8,884,610 B2
(45) Date of Patent: *Nov. 11, 2014

(54) MAGNETIC FIELD SENSOR

(71) Applicant: NXP B.V., Eindhoven (NL)

(72) Inventors: Robert Hendrikus Margaretha Van Veldhoven, Dommelen (NL); Jacobus Josephus Maria Ruigrok, Asten (NL); Joerg Stegelmann, Noderstedt (DE)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/010,020

(22) Filed: Aug. 26, 2013

(65) Prior Publication Data

US 2014/0021941 A1 Jan. 23, 2014

Related U.S. Application Data

(63) Continuation of application No. 12/816,720, filed on Jun. 16, 2010, now Pat. No. 8,547,087.

(30) Foreign Application Priority Data

Jun. 17, 2009 (EP) .................... 09251585

(51) Int. Cl.
| | | |
|---|---|---|
| *G01B 7/14* | (2006.01) | |
| *G01D 5/14* | (2006.01) | |
| *B82Y 25/00* | (2011.01) | |
| *G01R 33/00* | (2006.01) | |
| *G01R 33/07* | (2006.01) | |
| *G01R 33/09* | (2006.01) | |

(52) U.S. Cl.
CPC . *G01D 5/14* (2013.01); *B82Y 25/00* (2013.01); *G01D 5/145* (2013.01); *G01R 33/0035* (2013.01); *G01R 33/07* (2013.01); *G01R 33/091* (2013.01); *G01R 33/093* (2013.01); *G01R 33/096* (2013.01)
USPC ...... 324/207.19; 324/225; 324/526; 324/610; 324/648; 324/651

(58) Field of Classification Search
CPC ................... G01D 5/145; G01B 7/30
USPC ......... 324/255, 526, 610, 648, 651, 657, 666, 324/673, 680, 706, 725, 207.19
See application file for complete search history.

(56) References Cited

U.S. PATENT DOCUMENTS 6,212,783 B1    4/2001  Ott et al.
7,208,940 B2 *  4/2007  Withanawasam
                        et al. ................. 324/207.25

(Continued)

FOREIGN PATENT DOCUMENTS

DE    197 22 016 A1    12/1998
DE    100 17 061 A1    10/2001

OTHER PUBLICATIONS

Extended European Search Report for EP Patent Appln. No. 09251585.7 (Oct. 23, 2009).

*Primary Examiner* — Tung X Nguyen
*Assistant Examiner* — Alesa Allgood

(57) ABSTRACT

A magnetic field sensor assembly for measuring an angular direction of a sensed magnetic field relative to the assembly is disclosed. The sensor assembly includes a sensor of a first type configured to sense an orientation of the sensed magnetic field, a sensor of a second type configured to measure an orientation and a direction of the sensed magnetic field and processing circuitry connected to each of the magnetic field sensors. The processing circuitry being configured to process output signals from the sensor of the first type to determine an uncorrected sensed magnetic field angle and to apply an offset angle to the uncorrected magnetic field angle dependent on a logical combination of signs of output signals from the sensors of the first and second types.

15 Claims, 10 Drawing Sheets a)

b)

c)

d)

(56) References Cited

U.S. PATENT DOCUMENTS

| | | | |
|---|---|---|---|
| 8,547,087 B2 * | 10/2013 | van Veldhoven et al. | 324/207.19 |
| 2003/0090265 A1 | 5/2003 | Wan et al. | |
| 2008/0272771 A1 * | 11/2008 | Guo et al. | 324/260 |
| 2010/0007339 A1 * | 1/2010 | Ausserlechner | 324/207.21 |
| 2010/0321010 A1 * | 12/2010 | van Veldhoven et al. | 324/225 |
| 2012/0263985 A1 * | 10/2012 | Murata et al. | 429/90 |

* cited by examiner

MAGNETIC FIELD SENSOR

CROSS-REFERENCE TO RELATED APPLICATION

This application is a continuation of copending U.S. patent application Ser. No. 12/816,720, filed on Jun. 16, 2010, which claims priority to European patent application no. 09251585.7, filed on Jun. 17, 2009, the contents of which are incorporated by reference herein.

The invention relates to the field of magnetic sensors, and in particular to magnetic field sensors for determining the direction of a magnetic field.

Magnetic sensors are increasingly important in various industries. In the automotive industry sensors in particular, various sensors such as parking sensors, ABS (Automatic Braking System) sensors and tyre pressure sensors can be found in modern vehicles for improving comfort and safety. Magnetic sensors are particularly important in automotive applications, because magnetic fields penetrate easily through most materials. Magnetic sensors are also highly insensitive to dirt, unlike for example optical sensors. In many applications an angle must be measured, sometimes over a small range but often over more than 180° or over the full 360°. A full range of measurement is necessary for example in determining the absolute position of the rotor of a brushless motor or the crankshaft of an internal combustion engine.

Several different magnetic sensor technologies are currently available, such as sensors based on the Hall effect or the magnetoresistive effect. Anisotropic magnetoresistive (AMR) and giant magnetoresistive (GMR) sensors are particular examples of sensor types based on the magnetoresistive effect. Hall effect sensors can be integrated monolithically into integrated circuits, which makes them cheap, but they are also known for their low sensitivity and consequent inaccuracy. AMR sensors, while having a much higher sensitivity compared to Hall effect sensors, require more fabrication steps because they cannot be integrated monolithically, making a total sensor system more expensive. AMR sensors can be deposited, usually by sputtering of $Ni_{80}Fe_{20}$ on a separate die or on top of a monolithic structure. An annealing process, sometimes in a magnetic field, is used for stabilisation of the magneto-resistive material. Furthermore, simple AMR sensors do not have a 360° capability, as they cannot detect the sign of an applied magnetic field, only the orientation relative to the sensor.

As used herein, the term 'orientation' relates to the angle a magnetic field makes with a sensing axis, but without an indication of the direction of the field, i.e. its polarity. An angle of orientation will consequently have a maximum range of 180 degrees, whether this is from 0 to 180 degrees, −90 to +90 degrees or some other range spanning the same total. The term 'direction', on the other hand, relates to the polarity as well as the orientation of the magnetic field. An angle of direction therefore spans the full 360 degree range.

GMR sensors, which have a high sensitivity, are also able to distinguish the direction of a magnetic field. The application of GMR sensors therefore solves the problem of how to more accurately determine the direction and orientation of an applied magnetic field. GMR sensors will typically have a higher sensitivity than AMR sensors. However, a GMR sensor consists of various thin layers and critical interfaces. The technology required to fabricate such sensors is considerably more complicated and expensive. Furthermore, due to the thin multiple layers making up a GMR sensor, the operating temperature range is also limited.

In applications such as angular sensors, AMR sensors typically have the optimum trade-off between cost and sensitivity. Ordinary AMR sensors, however, lack the capability of carrying out a full 360° measurement.

Figure 1:
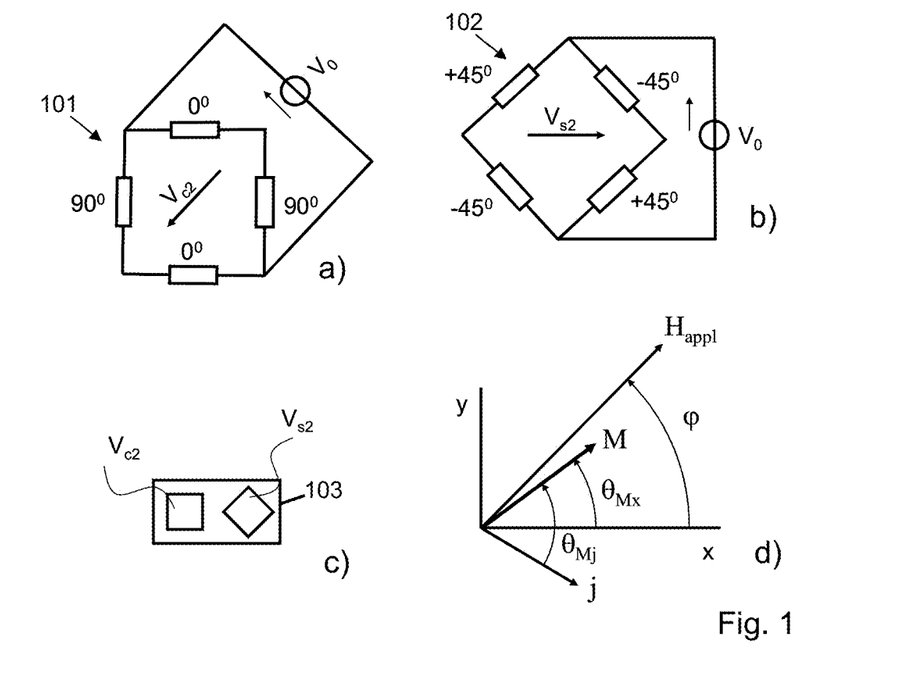
FIG. 1 is a schematic view of a pair of magnetoresistive sensor bridges and the relative orientation of an applied magnetic field.

A typical configuration for a pair of AMR sensor bridges is shown in FIG. 1. The sensor bridges 101, 102 each comprise one or more AMR sensors. The bridge 102 in FIG. 1b is rotated by 45 degrees with respect to the bridge 101 in FIG. 1a. Both bridges can be deposited on a single substrate 103 as sketched in FIG. 1c. The orientation of each resistive element relative to an x-axis indicated in FIG. 1d is also shown next to each element in FIGS. 1a and 1b. In the bridge of FIG. 1a, the resistive elements are oriented either 0 or 90 degrees to the x axis, and the resistive elements in the bridge of FIG. 1b are oriented either +45 or −45 degrees relative to the x axis. The voltages across each bridge, $V_{c2}$, $V_{s2}$, relative to an applied voltage $V_o$, are given by the following relationships:

$$V_{c2}/V_0 = \Delta R/R_0 = (1/2)(\Delta R_{max}/R_0)\cos(2\theta_{Mx})$$

$$V_{s2}/V_0 = \Delta R/R_0 = (1/2)(\Delta R_{max}/R_0)\sin(2\theta_{Mx})$$

Each AMR sensor in the bridge has a resistance, R, given by the following relationship:

$$R = R_0 + \Delta R = R_0 + \Delta R_{max}\cos^2(\theta_{Mj}) = R_0 + (1/2)\Delta R_{max} + (1/2)\Delta R_{max}\cos(2\theta_{Mj})$$

where $\theta_{Mj}$ is the angle between magnetization M and current j.

In describing operation of a bridge configuration, it is convenient to use the x axis as a reference instead of the current direction and to introduce the angle between magnetization and the x axis, $\theta_{Mx}$, as shown in FIG. 1d. In the branches of the bridge 101 of FIG. 1a, $\theta_{Mj} = \theta_{Mx}$ and $\theta_{Mj} = \theta_{Mx} + 90°$, while in the rotated bridge 102 of FIG. 1b, $\theta_{Mj} = \theta_{Mx} \pm 45°$. Due to the double angle, $2\theta_{Mj}$, in the above relationship for R, each 90° rotation of the bridge results in change of sign of the varying term, while a 45° rotation results in the term being a ±sine term instead of a cosine term. This leads, for the bridge 101 of FIG. 1a, to an output voltage $V_{c2}$ given by the following relationship:

$$V_{c2}/V_0 = \Delta R/R_0 = (1/2)(\Delta R_{max}/R_0)\cos(2\theta_{Mx}),$$

and for the 45° rotated bridge 102 to an output voltage $V_{s2}$ given by the following relationship:

$$V_{s2}/V_0 = \Delta R/R_0 = (1/2)(\Delta R_{max}/R_0)\sin(2\theta_{Mx}).$$

When only 1 or 2 of the resistance elements in a bridge is an AMR sensor, a comparably lower bridge voltage variation results.

For large applied fields with respect to anisotropy and demagnetizing fields, $\theta_{Mx} \to \phi$, where $\phi$ is the angle between the magnetic field $H_{appl}$ and the x axis (FIG. 1d). The ratio between the bridge output voltages then becomes:

$$V_{s2}/V_{c2} = \sin(2\theta_{Mx})/\cos(2\theta_{Mx}) = \tan(2\theta_{Mx}) \to \tan(2\phi).$$

So, the angle of the applied field with respect to the x axis follows for large fields from:

$$\phi \to (1/2)\arctan(V_{s2}/V_{c2}).$$

Note that the output is not dependent from the pre-factors in the bridge voltages, provided that matched bridges are used.

Since the arctan (or $\tan^{-1}$) function above is defined between −90° and +90°, the (½) arctan function ranges from −45° to +45°. Four possible values for $\phi$ therefore result when taking measurements over the full 360° range. By taking account of the signs of $V_{s2}$ and $V_{c2}$, the arctan range can be extended to the full 360° so that the (½) arctan range becomes 180°. This means that by knowing both $V_{s2}$ and $V_{c2}$, it is possible to reduce the number of possible values of $\phi$ to two, one being close to the actual value $\phi$ and the other close to $\phi+180°$. A pair of bridges using AMR sensors alone cannot, however, distinguish between these two values.

U.S. Pat. No. 6,212,783 B1 discloses the application of a Hall sensor in combination with a magnetoresistive sensor to determine the actual angular value of the direction of a magnetic field. A single Hall sensor is used, in the form of a Hall plate capable in measuring the field component perpendicular to the plate, i.e. parallel to the z-axis. This use of a single Hall sensor has the disadvantage that, near to 0° and 180°, the angle detection is ambiguous. Although this problem may be worked around, as stated in U.S. Pat. No. 6,212,783 B1 by any ambiguities being oriented to relate to the top dead centre points of the engine, these ambiguities still remain in the output signals of the sensor.

It is consequently an object of the invention to overcome such ambiguities in a magnetic sensor system, while avoiding the additional cost and complexity of GMR sensor-based systems.

According to the first aspect of the invention there is provided a magnetic field sensor assembly for measuring an angular direction of a sensed magnetic field relative to the assembly, the sensor assembly comprising:
a sensor of a first type configured to sense an orientation of the sensed magnetic field;
a sensor of a second type configured to measure an orientation and a direction of the sensed magnetic field; and
processing circuitry connected to each of the magnetic field sensors, the processing circuitry being configured to process output signals from the sensor of the first type to determine an uncorrected sensed magnetic field angle and to apply an offset angle to the uncorrected magnetic field angle dependent on a logical combination of signs of output signals from the sensors of the first and second types.

The sensor of the first type preferably comprises first and second sensor bridges having magnetic field sensing axes oriented at an angle relative to each other. The sensor bridges preferably each comprise one or more magnetoresistive elements. The sensor bridges may be oriented at approximately 45 degrees relative to each other. The magnetoresistive elements are preferably anisotropic magnetoresistive sensors.

The sensor of the second type preferably comprises first and second sensors having magnetic field sensing axes oriented substantially orthogonally relative to each other. In certain embodiments, however, it may be preferable for the magnetic field sensing axes of the first and second sensors of the second type to be oriented at angles other than 90 degrees relative to one another. The sensor of the second type preferably comprises one or more Hall effect sensor, and may for example comprise two such sensors oriented at an angle to one another.

The sensor of the second type may alternatively comprise two or more anisotropic magnetoresistive sensor elements having electrodes comprising electrically conductive stripes oriented at an angle to the length direction of each sensor so as to direct electrical current to pass through each sensor at 45 degrees with respect to the length direction of each sensor element.

The uncorrected magnetic field angle determined by the processing circuitry preferably has a 180 degree range, and the processing circuitry is configured to apply an offset angle of 180 degrees when a logical combination of the signs of the output signals indicate the sensed magnetic field is oriented between 180 and 360 degrees relative to the assembly.

The logical combination may be expressed as follows:
!Dc2 AND !Ds2 AND Ds1; OR
Dc2 AND !Ds2 AND !Dc1; OR
Dc2 AND Ds2 AND !Dc1; OR
!Dc2 AND Ds2 AND !Ds1,
where Dc2 and Ds2 are logical values indicating the sign of the output signals from first and second sensors of the first type and where Dc1 and Ds1 are logical values indicating the sign of output signals from first and second sensors of the second type, with !Dc1, !Ds1, !Dc2 and !Ds2 being the logical inverse of Dc1, Ds1, Dc2 and Ds2 respectively.

The uncorrected magnetic field angle determined by the processing circuitry may alternatively have a 90 degree range and the processing circuitry is configured to apply an offset angle of one of 90, 180, 270 and 360 degrees when a logical combination of the signs of the output signals indicate the sensed magnetic field is oriented between 45 and 135 degrees, 135 and 225 degrees, 225 and 315 degrees and 315 and 360 degrees respectively relative to the assembly.

In the above case, the processing circuitry may be configured to:
apply an offset angle of 90 degrees when the logical combination is ((!Dc2 AND Ds2) OR (!Dc2 AND !Ds2)) AND Ds1;
apply an offset angle of 180 degrees when the logical combination is ((Dc2 AND !Ds2) OR (Dc2 AND Ds2)) AND !Dc1;
apply an offset angle of 270 degrees when the logical combination is ((!Dc2 AND Ds2) OR (!Dc2 AND !Ds2)) AND !Ds1; and
apply an offset angle of 360 degrees when the logical combination is Dc2 AND !Ds2 AND Dc1,
where Dc2 and Ds2 are logical values indicating the sign of the output signals from first and second sensors of the first type and where Dc1 and Ds1 are logical values indicating the sign of output signals from the first and second sensors of the second type, with !Dc1, !Ds1, !Dc2 and !Ds2 being the logical inverse of Dc1, Ds1, Dc2 and Ds2 respectively.

According to a second aspect of the invention there is provided a method of measuring an angular direction of a magnetic field, the method comprising:
measuring an orientation of the magnetic field with a sensor of a first type;
measuring an orientation and a direction of the magnetic field with a sensor of a second type;
processing output signals from the sensor of the first type to determine an uncorrected sensed magnetic field angle; and
applying an offset angle to the uncorrected magnetic field angle dependent on a logical combination of signs of output signals from the sensors of the first and second types to obtain an output signal of the angular direction of the magnetic field.

An advantage of the invention is that of allowing for a way of combining different inexpensive and relatively simple magnetic sensors to provide an angular magnetic sensor capable of measuring accurately and unambiguously the direction of a magnetic field over a full 360° range of measurement.

A sensor assembly according to the invention avoids the two alternative possible values for $\phi$ that may hamper a cheap, accurate and robust AMR sensor assembly for measuring the direction of a relatively strong magnetic field. This is solved by introducing Hall effect sensors or other low-grade sensors that are capable of carrying out a 360° measurement. For example, a first low-grade sensor is used for roughly measuring the direction of one of the applied field components and a second low-grade sensor is used to measure the other applied field component.

The invention allows for a general solution for an accurate high-field sensor system without the weaknesses inherent in prior solutions, as a magnetic sensor according to the invention can be configured to provide an unambiguous result in detected angle over the whole 360 degree range of detection.

An advantage of the invention is that the sensor apparatus can to a large extent be made independent from any inaccuracies in the output of the sensor of the second type, which only need to be used to provide an unambiguous indication of sign or interval of the sensed magnetic field. The logical combination of the two types of sensor allows for a determination of which sector the sensed magnetic field lies in. For applications where a full 360 degree sensing is required, the logical combination can determine unambiguously which octant (i.e. which out of the eight 45 degree intervals) the sensed magnetic field direction is in.

A particular feature of the invention is that only instantaneous signals from the sensors are required for the determination of the absolute direction of the sensed magnetic field. A history of the magnetic field direction is not required. A further advantage of the invention is therefore that the magnetic sensing apparatus is able to operate immediately upon start-up and is immediately as accurate as at any other time. This feature is important for certain safety critical applications and is required for zero-speed start-up brushless motor control applications.

The invention is described in further detail below by way of illustrative examples and with reference to the accompanying drawings, in which.

In various arrangements described herein, two Hall effect sensors are employed, these sensors being arranged with their magnetic field sensing axes substantially orthogonal to each other and configured to measure the direction of a magnetic field in the same plane. A double Hall effect sensor may be used for this purpose. Other types of magnetic field sensors may alternatively be used, provided these are capable of measuring over a 360 degree range of angles. Sensors for determining the direction of the magnetic field can be of relatively low grade, since they are effectively only used for determining the correct sign or interval of the measured magnetic field, while a more accurate orientation measurement is determined by another sensor. The purpose of the Hall effect sensors is therefore to reduce the possible values for ϕ to a single correct value for any angle within the full 360 degree range of the sensor assembly.

With the plane of detection of the sensor aligned according to x- and y-axes as shown in FIG. 1d, a z-direction may be defined as being parallel to the direction of the axis of the rotor of an electric motor or parallel to the direction of the rotation axis of the crank of a combustion engine.

For relatively small applied fields, demagnetizing and anisotropy fields become more important. The relation between $\theta_{Mx}$ and ϕ can then become quite complicated, and can even depend on the magnetic history of the sensor. Proper DC biasing means and resetting means are then preferred or necessary for optimal operation of the device.

Figure 2:
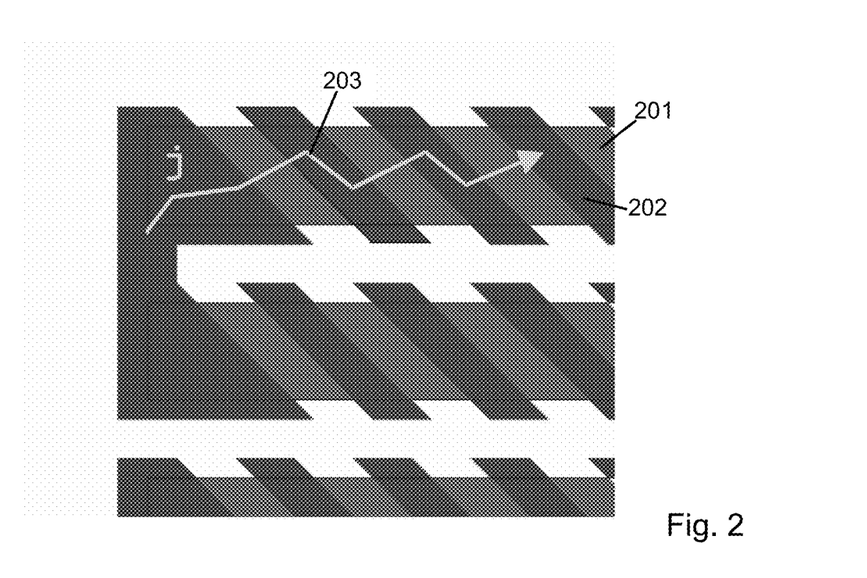
FIG. 2 is a schematic plan view of a series of AMR sensor elements, each element having conductive 'barber pole' stripes to force electrical current through the sensor at 45 degrees to the sensing axis.

For maximum sensitivity at a small applied field with respect to demagnetizing, anisotropy and DC-bias fields, orientation of the current at about ±45 degrees with reference to the longitudinal axis of the magnetoresistive sensor is generally preferred. For this purpose, conductive stripes can be deposited on the sensors at ±45 degrees to the length direction of the sensors, as shown in FIG. 2 in which a schematic view of a part of an AMR sensor assembly is shown. Electrically conductive 'barber pole' stripes 202 are provided on top of each AMR sensor 201. The stripes 202 force electrical current 203 to pass through each AMR sensor at 45 degrees with respect to the length (x) direction of the sensors.

Figure 3:
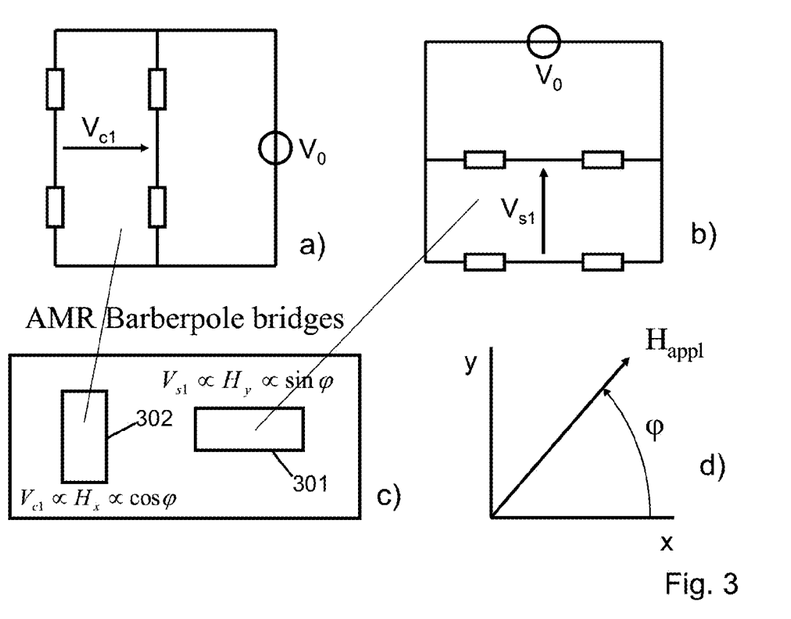
FIG. 3 is a schematic view of a pair of AMR 'barber pole' bridges.

For maximum (magnetic) small-signal sensitivity of the above-described type of AMR sensors, it is necessary to orient the length direction of all sensors perpendicular to the component of the field to be measured. This means that a first bridge for sensing the y component of the applied field has all its sensors aligned along the x axis and a second bridge for sensing the x component of the applied field has all its sensors aligned along the y axis. This arrangement is illustrated in FIG. 3, with the orientations of the two AMR barber pole sensor bridges shown in FIGS. 3a and 3b, and a schematic illustration of a die having both bridges shown in FIG. 3c. The output for small fields is a linear function of the component of the applied field component orthogonal to each sensor. Each sensor is not sensitive to the applied field component parallel to the sensor axis. The output of the bridge 301 in FIG. 3c is $V_{s1} \propto H_y \propto \sin\phi$ and the second bridge 302 is $V_{c1} \propto H_x \propto \cos\phi$. The angle of the applied field, shown in FIG. 3d, follows from the output of the 2 matched bridges according to the following:

$$\phi = \arctan(V_{s1}/V_{c1}).$$

By taking account of the signs of $V_{c1}$ and $V_{s1}$, a single unambiguous value for $\phi$ can be determined.

A disadvantage of such a sensor is that, at low fields, the sensor output can change sign when the magnetization along the length of the sensor element flips, for example due to a large magnetic field spike. When this happens only in part of the element, the overall amplitude of the output signal reduces. In an AMR sensor without the 'barber pole' stripes shown in FIG. 3, this has either very little or no effect.

For large fields the response of the above described 'barber pole' bridges becomes sensitive to the other component of the applied field as well, which makes this method unsuitable for large magnetic fields. Reducing the applied field source itself or partly shielding all external fields may avoid this. For many applications, particularly where maximum accuracy and reliability is required, reducing the applied field or providing appropriate shielding may not be an option. The contributions of disturbing fields from the external environment, which will increase in relative magnitude if the applied field source itself is decreased, as well as the contributions from disturbing forces and inaccuracies in the sensors themselves, will then have a deleterious impact on the response of the device.

A magnetic field sensor assembly according to embodiments of the present invention allows for a method of measuring the direction of a relatively strong magnetic field using cheap, accurate and robust AMR sensor technology, thereby avoiding the two possible values for $\phi$ in a full 360° measurement that may otherwise hamper accurate magnetic field angle detection. A relatively strong magnetic field can be defined to be a field that has a magnitude substantially larger than the net anisotropic field of the sensor, which represents the combined effect of the demagnetizing field of the element(s) and the intrinsic anisotropy of the AMR sensor material. Avoiding the two possible values for $\phi$ may be achieved by adding one or more (low-grade) 360° sensors so that a single unambiguous value of $\phi$ close to the actual direction of the local applied field can be determined.

Certain embodiments combine two AMR bridges with two Hall effect sensors, or alternatively with a double Hall sensor. The Hall sensors are used for detecting the sign or interval of the magnetic field, while the angular AMR sensors are used to accurately measure the angle of the local magnetic field over a 180° range. In combination, with appropriate processing as described in further detail below, this allows for an accurate and unambiguous determination of the direction of the magnetic field, without the separate limitations of the AMR sensors and Hall sensors.

Figure 4:
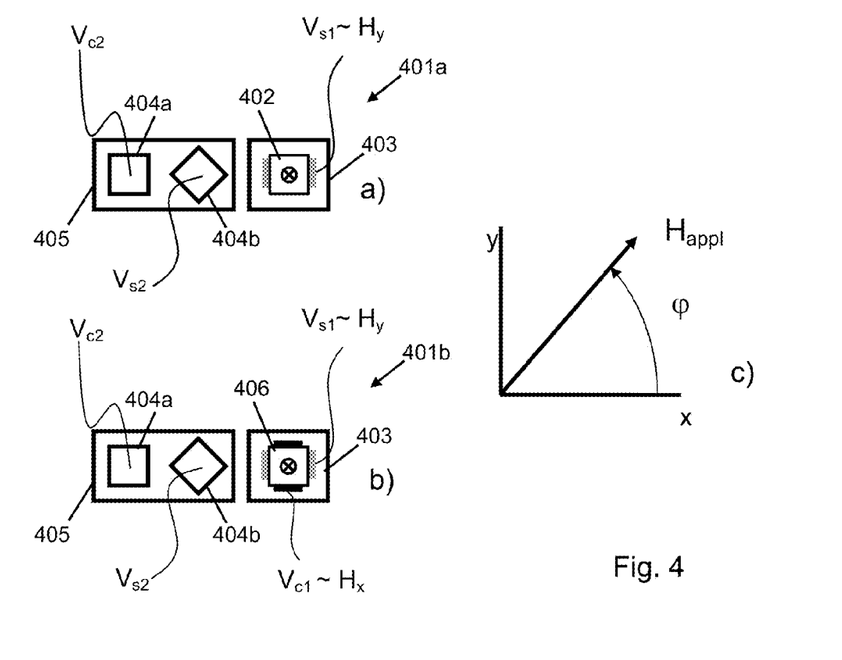
FIGS. 4a and 4b are schematic illustrations of two die sensor assemblies having a pair of AMR sensors and a single or double Hall effect sensor.
FIG. 4c is a diagram illustrating the relationship between the measured magnetic field $H_{appl}$ and the axes of the sensor assemblies of FIGS. 4a and 4b.

Alternative implementations with a single and double Hall element are shown schematically in FIGS. 4a and 4b, with FIG. 4c indicating the relative orientation of the applied magnetic field $H_{appl}$ to the x and y axes of the sensors. FIG. 4a shows a two-die sensor assembly 401a, with a single Hall element 402 that is sensitive to the y component of the applied magnetic field $H_{appl}$. The Hall element 402 may be implemented on a C-MOS die 403, with two AMR bridges 404a, 404b formed on a separate silicon die 405. The two dies 403, 405 are preferably placed in close proximity to one another, so that the magnetic field measurements are as similar as possible.

FIG. 4b illustrates a two-die sensor assembly 401b with a double Hall element 406 for measuring both x and y components of the field, the Hall element 406 being formed on the C-MOS die 403 and the pair of AMR bridges 404a, 404b on a separate silicon die. One or both of the dies 403, 405 preferably comprise the processing circuitry required to extract and process the signals from the sensors 404a, 404b, 402, 406. Operation of the processing circuitry is described in further detail below. The cross in the center of the Hall sensor 402, 406 indicates that the direction of the Hall current is perpendicular to the die (in the z-direction) in order to be able to measure the in-plane (x and y) field components.

Figure 5A:
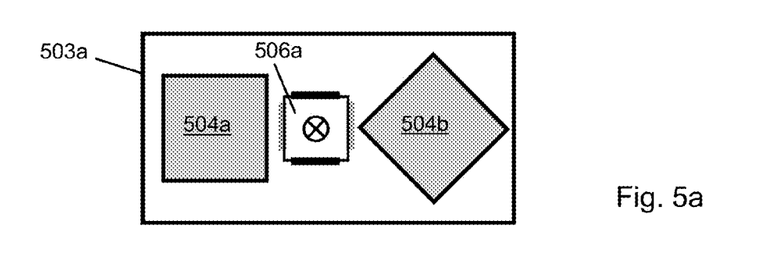
FIGS. 5a and 5b are schematic plan views of two alternative arrangements for single die sensor assemblies.
Figure 5B:
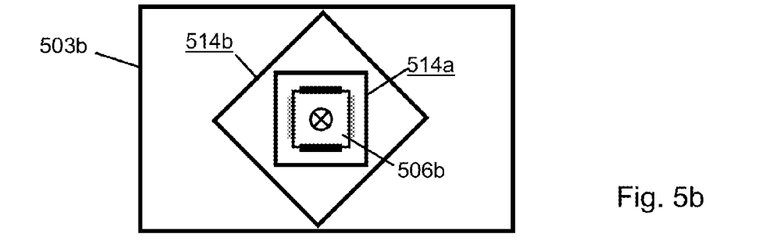

Alternative single-die implementations are illustrated in FIGS. 5a and 5b. In FIG. 5a, the AMR bridges 504a, 504b are formed on top of a C-MOS stack 503a, with a double Hall sensor 506a made in the C-MOS stack 503a between the bridges 504a, 504b. In FIG. 5b, both AMR bridges 514a and 514b are deposited on top of the C-MOS stack 503b around the Hall sensor 506b in the C-MOS stack, the AMR bridges having their axes centered with the axis of the Hall sensor. The embodiment in FIG. 5b allows for all these axes to be aligned with the axis of a well aligned rotating external magnetic field source, resulting in an improved accuracy of measurement.

A further possible embodiment comprises two AMR bridges in the form shown in FIGS. 1a and 1b above in combination with one or more 'barber pole' type AMR sensor bridges in the form described above in relation to FIG. 2, The barber pole bridges may be configured such that the magnetic response is made sufficiently insensitive so that double-valued angles will not appear during operation. The signals of these low-sensitivity barber pole bridges can then be used for detecting the sign or interval of the magnetic field, while more sensitive angular AMR sensors are used to accurately measure the angle of the local magnetic field within ranges of 180°.

The sensitivity of the barber pole type bridges may be reduced by shielding the bridges, for example by means of a cladding layer on top of the sensor, or by increasing the demagnetization field of the sensor, for example through use of a small sensor element width or a large AMR thickness.

The above low-grade bridge for the detection of the field sign or interval based on barber pole type AMR sensors can be made much smaller than the angular sensor bridges, because of its smaller sensor element width for low magnetic sensitivity and because a smaller signal to noise ratio can be tolerated compared with the more accurate angular sensor bridges.

A disadvantage of barber pole type sensor elements is that the output curve changes its sign when the magnetization in the whole element flips, for example due to a large field spike. This would lead to a wrong determination of the sign or interval of the applied field. A reduced sensitivity results if only a small part of the element flips, which would not generally be a problem in the present application. Such dramatically wrong state might be permanent until a next large field pulse would occur.

However, the current in the barber pole stripes during operation of the device may cause a net field in the AMR element with components in length and transverse direction. The current-field component in the length direction adds to the anisotropy 'field' when the magnetization has a component in the preferred length direction and decreases the net anisotropy 'field' for a magnetization in the opposite length direction. The latter is the case when the magnetization flipped in the past. For a sufficiently large sense current, the field from the sense current during operation always forces the magnetization back to have a component in the preferred length direction. In addition, this field from the current roughly doubles when the above shielding is used for reducing the magnetic sensitivity of the barber pole AMR element.

Increased demagnetization makes the anisotropy stronger. This reduces the change that flipping occurs, but unfortunately also requires larger sense currents to remove the semi-permanent effect of flipping.

Prior to operation, a very short and strong current in the direction of the sense current might be applied to overcome one or more of the above problems.

In all the above implementations, a relatively low-grade sensor is provided in the vicinity of a pair of AMR bridges. Alignment of the AMR bridges with respect to the rotation axis of the source of the applied magnetic field (for example the rotation axis of the shaft of the rotor of a brushless motor on which the applied field magnet may be mounted) is important for an accurate measurement of the angle of the magnet.

The lateral distance from the accurate bridges to the low-grade bridges should be relatively short compared to the distance to the magnet, which is usually easy to fulfill. In a single-die implementation this lateral distance can be made to be effectively zero.

Simulated signals resulting from an exemplary arrangement of sensors and bridges are shown in FIGS. 6a-d. In these figures:

$V_{c2}$ and $V_{s2}$ are the signals from the accurate 180° angular AMR bridges;

$V_{c1}$ and $V_{s1}$ are the signals from the low-grade 360° angular bridges (e.g. Hall effect bridges);

$D_{c2}$ and $D_{s2}$ are digital representations of the sign of $V_{c2}$ and $V_{s2}$, i.e. $D_{c2}=1$ if $V_{c2}>0$ and 0 otherwise; and $D_{c1}$ and $D_{s1}$ are digital representations of the sign of $V_{c1}$ and $V_{s1}$, i.e. $D_{c1}=1$ if $V_{c1}>0$ and 0 otherwise.

In each of the graphs of FIGS. 6a-d, the output signal of the sensor as a function of actual applied field angle is shown. For $V_{c2}$ this is a double cosine relationship, and for $V_{s2}$ is a double sine relationship.

Figure 6A:
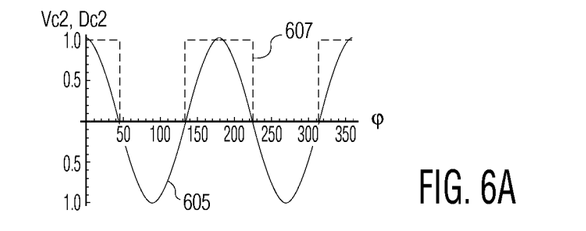
FIGS. 6a-d illustrate the relationships between output voltage signals from individual AMR and Hall sensors as a function of magnetic field angle.
Figure 6B:
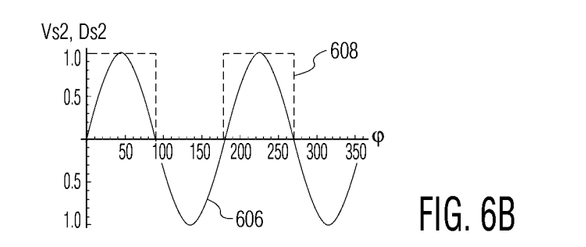
Figure 6C:
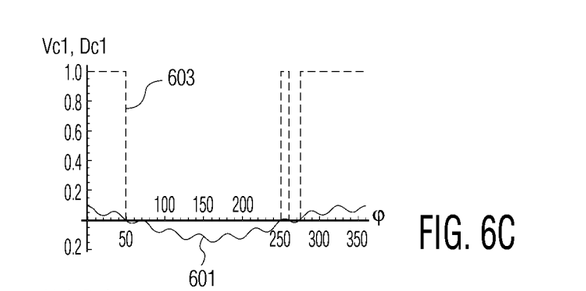
Figure 6D:
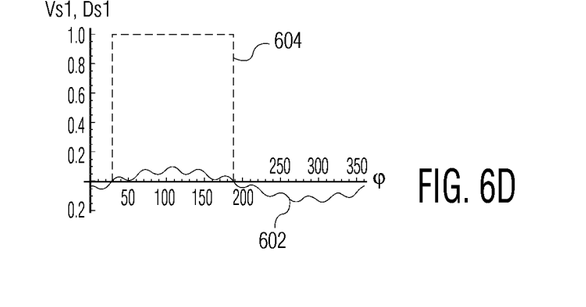

An artificial disturbing signal is added to the signals for $V_{c1}$ and $V_{s1}$ in FIGS. 6c and 6d, in order to demonstrate the advantages of combining two low-grade sensors to obtain an unambiguous direction measurement.

The following terms are used in describing the outputs of the exemplary embodiments:

$\phi_u$ is an uncorrected angle output from the pair of AMR bridges, derived from $\phi_u = (½) \arctan(V_{s2}/V_{c2})$;

$\phi_l$ is an angle output obtained from the low-grade sensors, derived from $\phi_l = (½) \arctan(V_{s1}/V_{c1})$; and $\phi_c$ is a corrected angle, obtained from $\phi_c = \phi_u + D10_x * 180$, where the block function $D10_x$ is 0 or 1 depending on one or more of the above signals.

As shown in FIGS. 6a-d, digital signals $D_{c2}$, $D_{s2}$, $D_{c1}$, $D_{s1}$ are derived from $V_{c2}$, $V_{s2}$, $V_{c1}$ and $V_{s1}$ for determining in which portion of the whole 360° range a measured angle is located. The signals may be derived from a pair of AMR bridges and a double Hall sensor, as described above. Low sensitivity barber pole AMR sensors may be used as an alternative to Hall sensors.

In the signals illustrated in FIGS. 6a-d, strong AC and DC error signals are added to all signals to show the reliability of the proposed method. These are particularly evident in signals $V_{c1}$ and $V_{s1}$ 601, 602 from the Hall sensor elements, where the simulated disturbances result in large errors in the resulting digital signals $D_{c1}$, $D_{s1}$ 603, 604. Exactly the same error signal is applied to the voltage outputs $V_{c2}$, $V_{s2}$ 605, 606, but because of the 10 times higher sensitivity of the accurate bridges it results in much smaller errors in the digital signals $D_{c2}$, $D_{s2}$ 607, 608. The digital signals $D_{c2}$, $D_{s2}$, $D_{c1}$, $D_{s1}$ are used in logical combinations to unambiguously identify the portion of the 360° range in which a measurement is being made.

From these logical combinations, a single digital signal $D10_x$ is derived that determines whether or not 180° will be added to the angle $\phi_u$ already derived from the accurate AMR sensors.

For only one Hall sensor, providing outputs Vc1, Dc1, the logical test $D10_x$, termed $D10_r$, is the following:

D10r=If[!Dc1,1,0].

Where two Hall sensors are used, providing outputs $V_{c1}$, $D_{c1}$, $V_{s1}$, $D_{s1}$, the logical test $D10_x$, now termed $D10_e$, is the following:

D10e=IF[((!Dc2&&!Ds2)&&Ds1)||((Dc2&&!Ds2)&&!Dc1)||((Dc2&&Ds2)&&!Dc1)||((!Dc2&&Ds2)&&!Ds1),1,0)

In the above logical tests, the notation is as follows:
! means NOT;
&& means AND;
|| means OR; and
,1,0 means THEN 1 ELSE 0.

The IF statements above are used to make the transition from the logic operations True-False to the digital levels 1-0.

Figure 7:
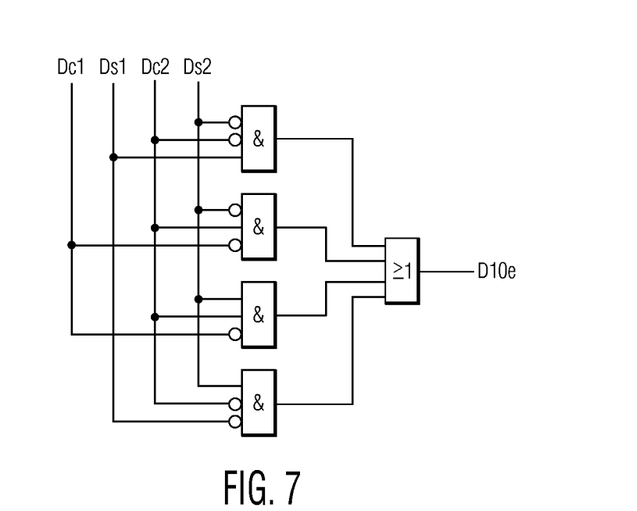
FIG. 7 is a schematic diagram of a logic circuit for providing an output to determine a correction to be applied to an uncorrected angle signal.

Shown in FIG. 7 is an exemplary implementation of the above way of determining the digital control signal $D10_e$, in the form of a combination of logical elements taking the inputs Dc1, Ds1, Dc2 and Ds2 and combining these according to the above logical relationship. The logical relationship for $D10_e$ can alternatively be expressed as follows:

$$D10e = \begin{matrix} ((D_{C2} == 0) \wedge (D_{S2} == 0) \wedge (D_{S1} == 1)) \vee \\ ((D_{C2} == 1) \wedge (D_{S2} == 0) \wedge (D_{C1} == 0)) \vee \\ ((D_{C2} == 1) \wedge (D_{S2} == 1) \wedge (D_{C1} == 0)) \vee \\ ((D_{C2} == 0) \wedge (D_{S2} == 1) \wedge (D_{S1} == 0)) \end{matrix}$$

where the signals $D_{c2}$, $D_{s2}$, $D_{c1}$, $D_{s1}$ represent digital signals (1 or 0) rather than logic signals (True or False), the symbol '∧' indicates AND, and the symbol '∨' indicates OR.

In the circuit shown in FIG. 7, each ○ symbol next to an AND module represents an inversion operation (i.e. 1->0 and 0->1). The AND module blocks (indicated by an '&' symbol) provide outputs equalling 1 only if all inputs are 1. The final block in the circuit provides a 1 output if at least one of the inputs is 1, i.e. the block represents an OR logical module. If the control signal $D10_e$=1, an angle of 180° is to be added to the uncorrected angular output $\phi_u$.

Figure 8:
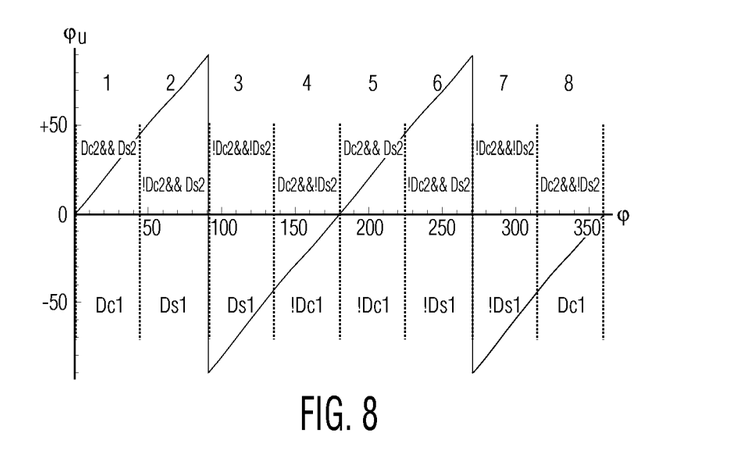
FIG. 8 illustrates the variation in an uncorrected value for measured magnetic field angle as a function of the actual magnetic field angle.

As shown in FIG. 8, the relationship of $\phi_u$ as a function of actual angle $\phi$ is divided into 8 intervals, or octants. The logical tests denoted in each interval are those that are either known, or are likely to be true, in that interval. A first logical test, indicated above the $\phi$-axis, is associated with the accurate 180° sensors, and a second logical test, indicated below the $\phi$-axis, is associated with the less accurate 360° sensors. For the low-grade sensors this indicates the most reliable quantity for a given interval. The logical tests used in each interval are summarised in the table below.

TABLE 1

Logical tests over 8 intervals of $\phi$.

| Interval | $\phi$ | Logical Test 1 | Logical Test 2 |
|---|---|---|---|
| 1 | 0-45° | Dc1 | Dc2&&Ds2 |
| 2 | 45-90° | Ds1 | !Dc2&&Ds2 |
| 3 | 90-135° | Ds1 | !Dc2&&!Ds2 |
| 4 | 135-180° | !Dc1 | Dc2&&!Ds2 |
| 5 | 180-225° | !Dc1 | Dc2&&Ds2 |

TABLE 1-continued

Logical tests over 8 intervals of φ.

| Interval | φ | Logical Test 1 | Logical Test 2 |
|---|---|---|---|
| 6 | 225-270° | !Ds1 | !Dc2&&Ds2 |
| 7 | 270-315° | !Ds1 | !Dc2&&!Ds2 |
| 8 | 315-360° | Dc1 | Dc2&&!Ds2 |

It can be readily determined that the logical test $D10_e$ results in an unambiguous output of sign or interval for φ provided any zero-crossing errors in the low-grade signals do not exceed 45°.

The output of the logical test can be used to apply a correction to the uncorrected angle $\phi_u$, resulting in a corrected angle, $\phi_c$. A correction of 360° may be added for negative values of $\phi_u$. When using only one low-grade sensor:

$$\phi_{c1}=\phi_u+180D10_r$$

$$\phi_c=\phi_{c1}+\mathrm{IF}[\phi_{c1}<0,360,0]$$

This results in 180° errors being corrected around where φ=90° and φ=270°.

When using two low-grade sensors, the above test $D10_e$, derived from the output of both sensors, is used:

$$\phi_{c2}=\phi_u+180D10_e$$

$$\phi_c=\phi_{c2}+\mathrm{IF}[\phi_{c2}<0,360,0]$$

Figure 9A:
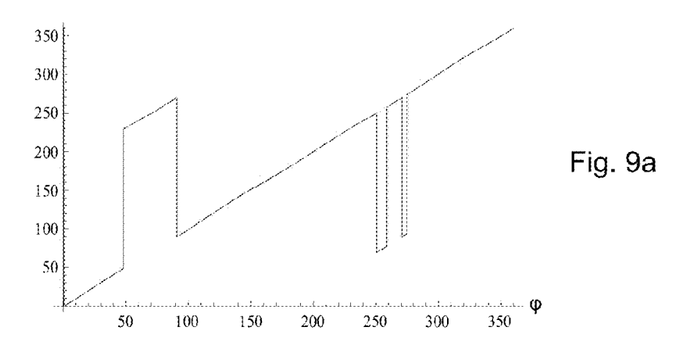
FIGS. 9a-c illustrate the variation and error in measured magnetic field angle as a function of actual magnetic field angle.
Figure 9B:
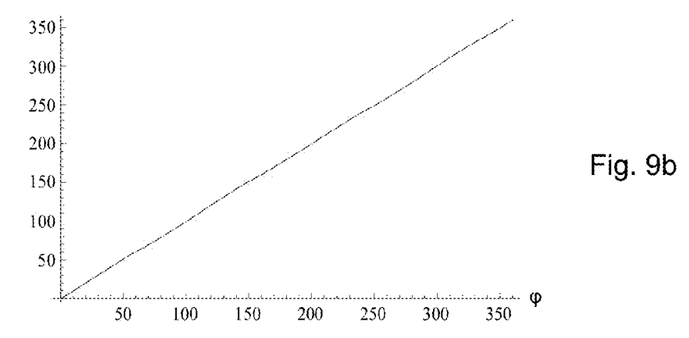
Figure 9C:
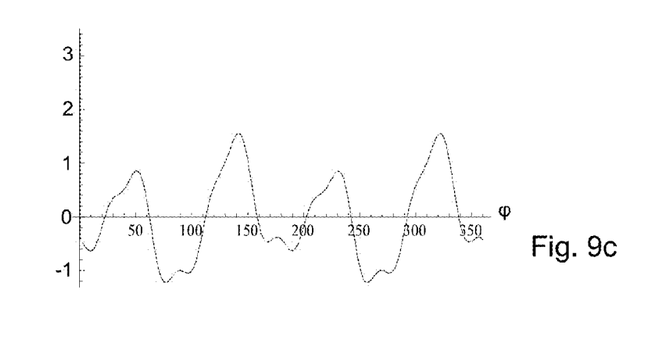

The results for each of the above approaches are shown in FIGS. 9a and 9b. FIG. 9a illustrates the output corrected angle $\phi_c$ using only one low-grade sensor, and FIG. 9b illustrates the output corrected angle using two low-grade sensors. In FIG. 9a, portions of the output corrected angle are clearly in error, resulting from uncertainties in the sign of the signal from the low-grade sensor. In FIG. 9b, on the other hand, no such large scale errors are visible in the corrected angle output. This is further confirmed in FIG. 9c, in which the error in the corrected angle is shown as a function of actual angle. This error is completely due to measurement errors in the accurate 180° sensors and not at all due to the (much larger) errors in the 360° sensors.

It has therefore been shown that the use of 2 low-grade 360° sensors in logical combination can result in the complete removal of all ambiguities for determining a corrected angular measurement of magnetic field. The accuracy of the corrected signal is completely independent of any inaccuracy in the outputs of the low-grade sensors, provided that any uncertainties in such sensors do not exceed 45°.

In a further example, the results of which are illustrated in FIGS. 10a to 10h, the errors in $V_{c2}$ and $V_{s2}$ have been made larger. This is not necessarily a realistic simulation, but demonstrates that the 180° correction scheme based on the logical test $D10_e$ above works well in avoiding any ambiguity in the angle determination, even under extreme circumstances.

Figure 10A:
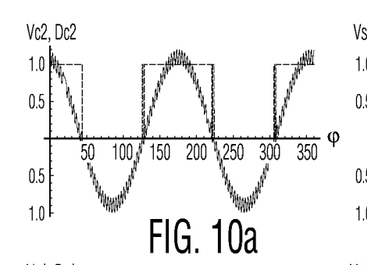
FIG. 10a-h illustrate further variation in output voltage signals and measurement error as a function of actual magnetic field angle.
Figure 10B:
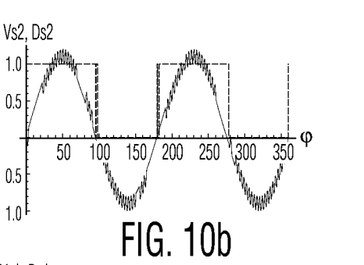
Figure 10C:
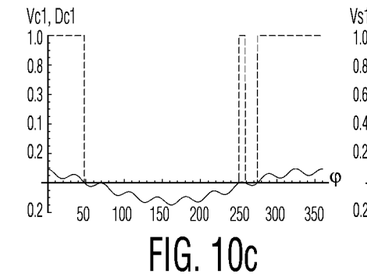
Figure 10D:
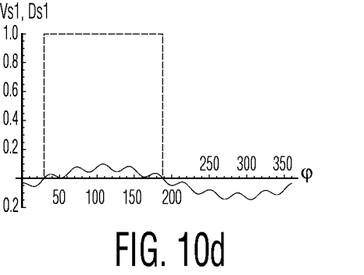
Figure 10E:
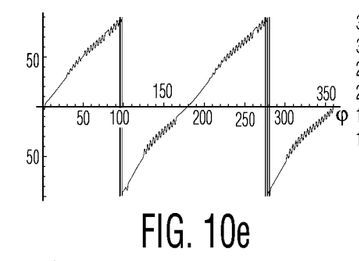
Figure 10F:
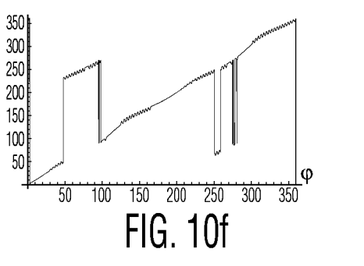
Figure 10G:
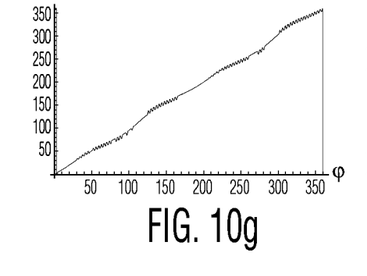
Figure 10H:
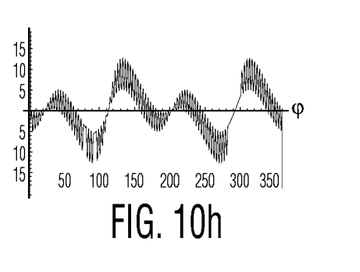

In FIGS. 10a and 10b, substantial DC and AC errors were applied to the voltage outputs $V_{c2}$, $V_{s2}$. In FIGS. 10c and 10d, similar errors are shown to those applied in the example above. FIG. 10e illustrates the uncorrected angle, $\phi_u$, and FIGS. 10f and 10g illustrate the corrected angle outputs when using a single low-grade sensor (FIG. 10f) and two low-grade sensors (FIG. 10g). FIG. 10h illustrates the error signal in the corrected output of FIG. 10g, which again is solely due to the errors in the higher grade sensors.

Figure 11:
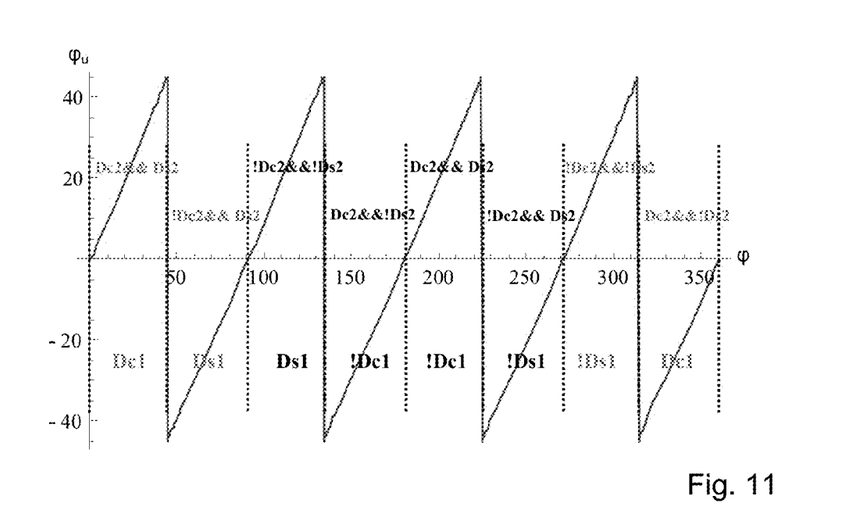
FIG. 11 illustrates the variation in an alternative uncorrected value for measured magnetic field angle as a function of the actual magnetic field angle.

In the case where an operation to determine $\phi_u=(\frac{1}{2})$ arctan $(V_{s2}/V_{c2})$ is not available, for example where only a look-up table for a more simplified arctan [x] function is available, i.e. one that does not take account of the signs of both $V_{s2}$ and $V_{c2}$, then the uncorrected angle $\phi_u$, illustrated in FIG. 11 results. The uncorrected angle ranges over only 90°, rather than 180°. A combination of the digitised versions of the output signals from all sensors can be used to determine what correction needs to be made to obtain the corrected angle $\phi_c$.

As before, the 360° range is divided into 8 intervals 1-8. For the desired unambiguous output:

in intervals 2 and 3, 90° has to be added
in intervals 4 and 5, 180° has to be added
in intervals 6 and 7, 270° has to be added; and
in interval 8, 360° has to be added.

One way of implementing the above corrections is through the use of logical values $D_{s2}$ and $D_{c2}$ to obtain the uncorrected $\phi_u$, of FIG. 8, and then to proceed with the logical operations as used earlier. The most straightforward way, however, is to perform above operations in one step using all the logic quantities given in each interval for the unambiguous ascertainment of each interval. This leads to the following expression for performing all the necessary operations:

$$\phi_c=\phi_u+\mathrm{If}[((!Dc2\&\&Ds2)\|(!Dc2\&\&!Ds2))\&\&Ds1,90,\\ 0]+\mathrm{If}[((Dc2\&\&!Ds2)\|(Dc2\&\&Ds2))\&\&!Dc1,\\ 180,0]+\mathrm{If}[((!Dc2\&\&Ds2)\|(!Dc2\&\&!Ds2))\\ \&\&!Ds1,270,0]+\mathrm{If}[(Dc2\&\&!Ds2)\&\&Dc1,360,0]$$

The result of this is the same as the output shown in FIG. 9b.

Figure 12:
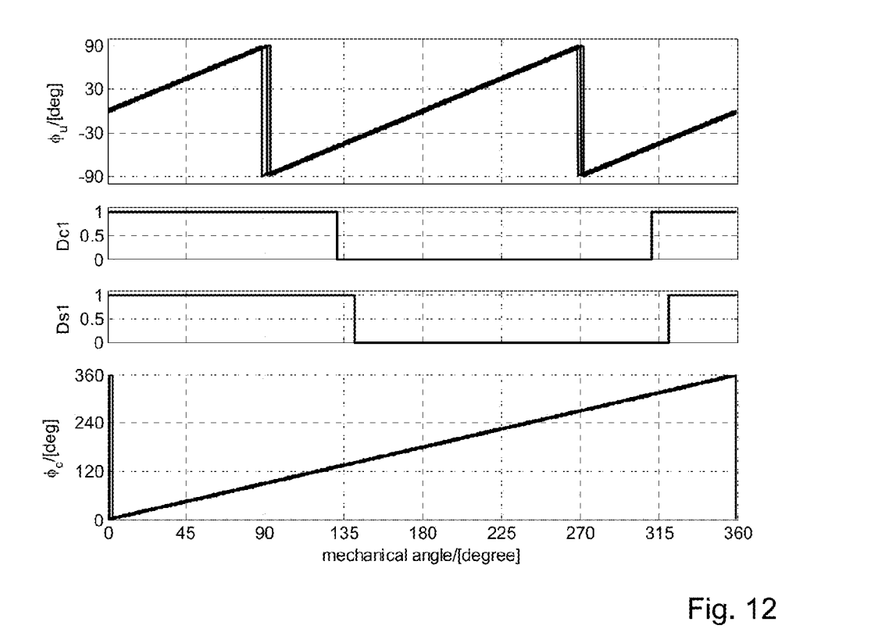
FIG. 12 illustrates the variation in magnetic field angle measurement as a function of actual magnetic field angle with corrections applied.
Figure 13:
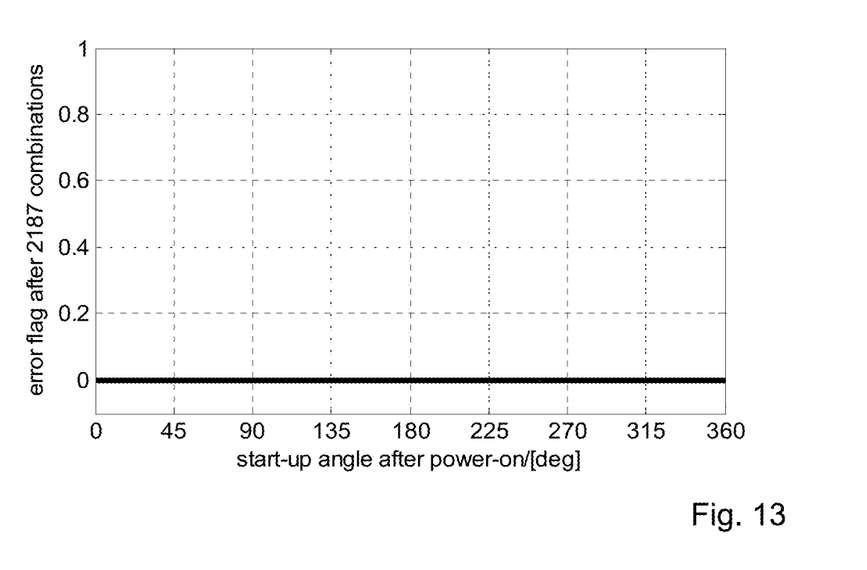
FIG. 13 illustrates simulation results of the variation in measured output signals as a function of magnetic field angle.

In the following two examples, the results of which are illustrated in FIGS. 12 and 13, an alternative octant prediction circuit is applied. This alternative circuit provides the digital control signal $D10_q$, determined according to the following relationship:

$$D10q = \begin{matrix} ((D_{C1}==0)\wedge(D_{S1}==0)\wedge(\varphi_U>-45°))\vee \\ ((D_{C1}==1)\wedge(D_{S1}==0)\wedge(\varphi_U<45°))\vee \\ ((D_{C1}==1)\wedge(D_{S1}==1)\wedge\overline{(\varphi_U>-45°)})\vee \\ ((D_{C1}==0)\wedge(D_{S1}==1)\wedge\overline{(\varphi_U<45°)}), \end{matrix}$$

where, as before, the symbol '∧' means AND, and the symbol '∨' means OR. If the control signal $D10_q=1$, an angle of 180° will be added to $\phi_u$ to obtain $\phi_c$. Note that in contrast to the previous choice D10e a calculation of $\phi_u$ is necessary prior to performing above logical operation. Using the above relationship, a calculation can be made of a 'worst case' scenario, where the angular errors of each Hall sensor (or switch) are made artificially large:

| | |
|---|---|
| The angle error of the $D_{c1}$ Hall switch | −40° |
| The angle error of the $D_{s1}$ Hall switch | +40° |
| The AMR element has an additional phase error | ±2° |

FIG. 12 illustrates the system behaviour in this case, demonstrating again the relative insensitivity of the sensor system against errors, using another logical detection scheme than in the earlier examples.

Again, the total angle error is only determined by the AMR element and is independent of the large angle error of the Hall switches. This error, of about 2°, is present at all angles, but effects of its existence are only clearly visible around the mechanical angle φ=0° where the angle error causes (irrelevant) switches of $\phi_c$ from 0° to 360° and vice versa at φ=+ and −2°

For a high speed application such as in a brushless motor, the calculation effort for the 360° capability is typically large, because the equation uses the angle information $\phi_u$.

FIG. 13 illustrates simulation results demonstrating how the measurement system operates in response to a power-on reset. Various existing sensor systems for making angular measurements take account of a sensed magnetic field history in order to make the right decision when two or more possible actual angles can result from instantaneous output signals. The most likely quadrant (or octant, etc.) in which the actual angle is present is therefore predicted from the history of the sensor output rather than from the signals measured at that particular moment. For embodiments of the invention described herein, only the signals measured at any particular moment need to be used for determining the 2 or more possible angles at that moment.

A consequence of the method of calculation is that the start-up (after power on) behaviour is no different to the behaviour under any other circumstance. FIG. 13 shows the result of a variation of the start-up angle (from 0° up to 360° in 1° steps) in simulations, and clearly indicates that this has no effect at all on the error. For each start-up angle, 2187 different parameter combinations were simulated. The result for each case is an error flag, which goes high (=1) if an 'octant decision error' is detected, which means that the maximum total angle error is larger then approximately 45°. No errors were detected during the simulation over the entire range of sensed angles. The sensor system is therefore expected to be robust on start-up as well as during normal operation.

For the parametric 'sweep', the following discrete values were used as system tolerances, and Hall effect sensors were assumed, configured to measure over a 360 degree range.

| | | |
|---|---|---|
| AMR offset (twice) | [−45 0 45] | percent of output amplitude |
| AMR phase error | [−1 0 1] | ° |
| Hall electrical offset (twice) | [−15 0 15] | percent of output amplitude |
| Hall switches angle error (twice) | [−20 0 20] | ° |
| Start up angle | [0:1:360] | ° |

The offset errors in both AMR bridges were varied independently from each other. The same is assumed for the angle errors of both parts of the Hall sensor. Only the phase errors in both AMR sensors are assumed to be equal, because it is likely that these errors are mainly due to misalignment of the die on which both sensors are placed.

Figure 14:
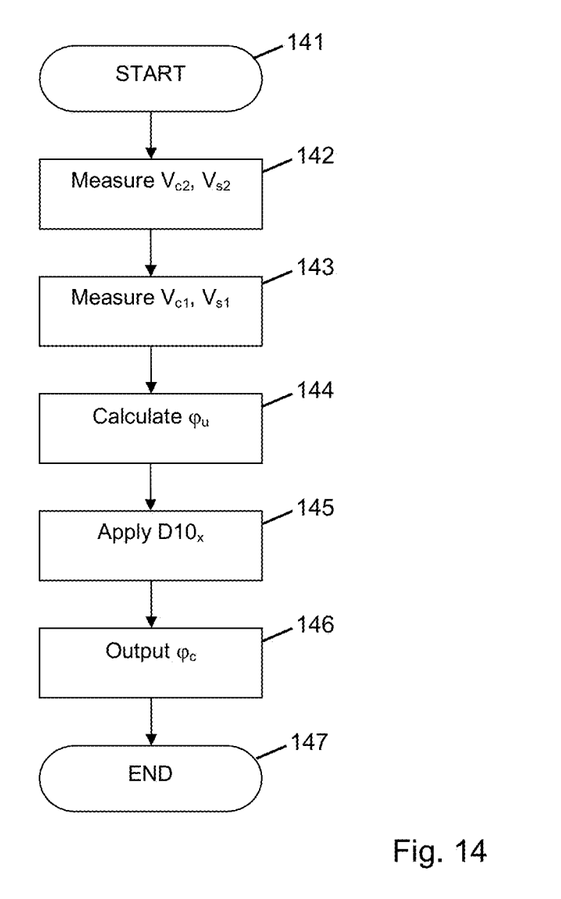
FIG. 14 is a flow diagram illustrating a method of carrying out the invention.

In general, the octant prediction circuits described herein will operate perfectly provided the sum of all possible error sources is smaller than 45°, as was the case for all possible combinations in the above described simulation. The following equation provides a rough criterion for the allowable tolerances.

$$\Delta\varphi_{AMR} + \Delta\varphi_{Hall} + 0.42 * offset_{AMR} + \frac{90}{\pi} * \arcsin\left(\frac{offset_{HALL}}{100}\right) \leq 45°$$

where $\Delta\varphi$ is the phase shift of the sinusoidal signal in degrees and the term offset is the relative offset in percentage of signal amplitude (i.e. half of the top-top value). The units for the tolerances in this criterion are as used in the above tolerance lists. FIG. 14 illustrates in a general aspect a method of performing the invention in the form of a flow diagram, comprising a single sequence of steps from start (step 141) to finish (step 147). In practice, the method will be carried out repeatedly, typically many times each second depending on the frequency at which the output measurement angle needs to be updated. At step 142, output signals from the AMR sensors, $V_{c2}$, $V_{s2}$, are measured. This also results in values being obtained for $D_{c2}$, $D_{s2}$. At step 143, output signals from the Hall effect sensors, $V_{c1}$, $V_{s1}$, are measured, which also results in values being obtained for $D_{c1}$, $D_{s1}$. Steps 142, 143 may be carried out simultaneously, in parallel or in an alternate order. At step 144, the uncorrected angle, $\phi_u$, is determined from the AMR sensor outputs $V_{c2}$, $V_{s2}$. The logical test D10$_x$, as described above, is then applied to determine the correct offset to add to the uncorrected angle. The corrected angle, $\phi_c$, is then output at step 146 and the process ends (step 147).

Other embodiments are intentionally within the scope of the invention as defined by the appended claims.

The invention claimed is:

1. A magnetic field sensor assembly configured to measure an angular direction of a sensed magnetic field relative to the assembly, the sensor assembly comprising:
   a sensor of a first type configured to sense at least one of an orientation and a direction of the sensed magnetic field;
   a sensor of a second type configured to measure only a sign or an interval of the sensed magnetic field; and
   processing circuitry connected to each of the magnetic field sensors, the processing circuitry being configured to process output signals from the sensor of the first type to determine an uncorrected sensed magnetic field angle and to apply an offset angle to the uncorrected magnetic field angle dependent on a logical combination of signs of output signals from the sensors of the first and second types,
   wherein the uncorrected magnetic field angle has a 90 degree range and the processing circuitry is configured to apply an offset angle of one of 90, 180, 270 and 360 degrees when a logical combination of the signs of the output signals indicate the sensed magnetic field is oriented between 45 and 135 degrees, 135 and 225 degrees, 225 and 315 degrees, and 315 and 360 degrees respectively relative to the assembly.

2. The magnetic field sensor assembly of claim 1, wherein the sensor of the first type comprises two or more magnetoresistive sensor elements.

3. The magnetic field sensor assembly of claim 1, wherein the sensor of the second type comprises one or more Hall effect sensor.

4. The magnetic field sensor assembly of claim 1, wherein the sensor of the second type comprises two or more anisotropic magnetoresistive sensor elements having electrodes comprising electrically conductive stripes oriented at an angle to the length direction of the sensor so as to direct electrical current to pass through the sensor at 45 degrees with respect to the length direction of each sensor element.

5. The magnetic field sensor assembly of claim 1, wherein the processing circuitry is configured to:
   apply an offset angle of 90 degrees when the logical combination is ((!Dc2 AND Ds2) OR (!Dc2 AND !Ds2)) AND Ds1;
   apply an offset angle of 180 degrees when the logical combination is ((Dc2 AND !Ds2) OR (Dc2 AND Ds2)) AND !Dc1;
   apply an offset angle of 270 degrees when the logical combination is ((!Dc2 AND Ds2) OR (!Dc2 AND !Ds2)) AND !Ds1; and
   apply an offset angle of 360 degrees when the logical combination is Dc2 AND !Ds2 AND Dc1,
where Dc2 and Ds2 are logical values indicating the signs of the output signals from first and second sensors of the first type and where Dc1 and Ds1 are logical values indicating the signs of output signals from the first and second sensors of the second type, with !Dc1, !Ds1, !Dc2 and !Ds2 being logical inverses of Dc1, Ds1, Dc2 and Ds2 respectively.

6. The magnetic field sensor assembly of claim 1, wherein the sensed magnetic field is divided into a plurality of intervals.

7. The magnetic field sensor of claim 1, wherein the sensor of the first type comprises first and second sensor bridges having magnetic field sensing axes oriented at an angle relative to each other.

8. The magnetic field sensor of claim 7, wherein the first and second sensor bridges each comprise one or more magnetoresistive elements.

9. The magnetic field sensor of claim 8, wherein the first and second sensor bridges are oriented at approximately 45 degrees relative to each other.

10. The magnetic field sensor of claim 1, wherein the sensor of the second type comprises first and second sensors having magnetic field sensing axes oriented at an angle relative to each other.

11. The magnetic field sensor of claim 10, wherein the angle is approximately 90 degrees.

12. The magnetic field sensor assembly of claim 1, wherein the uncorrected magnetic field angle has a 180 degree range, and the processing circuitry is configured to apply an offset angle of 180 degrees when a logical combination of the signs of the output signals indicate the sensed magnetic field is oriented between 180 and 360 degrees relative to the assembly.

13. The magnetic field sensor assembly of claim 12, wherein the logical combination is:
!Dc2 AND !Ds2 AND Ds1; OR
Dc2 AND !Ds2 AND !Dc1; OR
Dc2 AND Ds2 AND !Dc1; OR
!Dc2 AND Ds2 AND !Ds1, wherein the sensor assembly comprises first and second sensors of the first type and first and second sensors of the second type, where Dc2 and Ds2 are logical values indicating the signs of the output signals from the first and second sensors of the first type and where Dc1 and Ds1 are logical values indicating the signs of output signals from the first and second sensors of the second type, with !Dc1, !Ds1, !Dc2 and !Ds2 being the logical inverse of Dc1, Ds1, Dc2 and Ds2 respectively.

14. A method of measuring an angular direction of a magnetic field, the method comprising:
measuring an orientation of the magnetic field with a sensor of a first type;
measuring only a sign or an interval of the magnetic field with a sensor of a second type;
processing output signals from the sensor of the first type to determine an uncorrected sensed magnetic field angle; and
applying an offset angle to the uncorrected magnetic field angle dependent on a logical combination of signs of output signals from the sensors of the first and second types to obtain an output signal of the angular direction of the magnetic field, wherein the uncorrected magnetic field angle has a 90 degree range, and wherein applying the offset angle to the uncorrected magnetic field angle comprises applying an offset angle of one of 90, 180, 270 and 360 degrees when a logical combination of the signs of the output signals indicate the sensed magnetic field is oriented between 45 and 135 degrees, 135 and 225 degrees, 225 and 315 degrees, and 315 and 360 degrees respectively.

15. The method of claim 14, wherein the magnetic field is divided into a plurality of intervals.

* * * * *